United States Patent [19]

Coll-Palagos

[11] 4,278,739

[45] Jul. 14, 1981

[54] ELECTROLESS METAL PLATED LAMINATES

[75] Inventor: Miguel Coll-Palagos, Rye, N.Y.

[73] Assignee: Stauffer Chemical Company, Westport, Conn.

[21] Appl. No.: 57,877

[22] Filed: Jul. 16, 1979

Related U.S. Application Data

[60] Division of Ser. No. 6,141, Jan. 24, 1979, which is a continuation-in-part of Ser. No. 871,308, Jan. 23, 1978, abandoned, which is a continuation of Ser. No. 735,243, Oct. 26, 1976, abandoned, which is a division of Ser. No. 561,957, Mar. 25, 1975, abandoned.

[51] Int. Cl.$^3$ .............................................. C23C 3/02
[52] U.S. Cl. ................................. 428/623; 204/38 B; 427/443.1; 428/304; 428/313; 428/316; 428/320; 428/334; 428/460; 428/463; 428/464; 428/624; 428/626; 428/936
[58] Field of Search .................. 260/30.4 N; 525/205; 428/522, 623, 304, 313, 316, 320, 334, 460, 463, 464, 624, 626, 936; 204/38 B; 427/443.1

[56] References Cited

U.S. PATENT DOCUMENTS

| 2,853,465 | 9/1958 | Werner | 525/205 |
| 3,549,505 | 12/1970 | Hanusa | 204/11 |
| 3,628,990 | 12/1971 | Kamada et al. | 427/306 |
| 3,632,704 | 1/1972 | Coll-Palagos | 427/307 |
| 3,679,552 | 7/1972 | Jervis | 204/37 R |
| 3,698,929 | 10/1972 | Diebold | 427/404 |
| 3,907,737 | 9/1975 | Marx et al. | 260/29.6 R |

OTHER PUBLICATIONS

Kirk-Olhmer, "Encyclopedia of Chemical Technology" vol. 21, pp. 427–430, ©1968.

*Primary Examiner*—John D. Smith
*Attorney, Agent, or Firm*—Vivienne T. White

[57] ABSTRACT

A method of metallizing materials by coating a substrate material with a hydrophilic composite material; electrolessly metal plating the hydrophilic composite material with a metal to render the surface conductive; followed by electroplating a metal onto the conductive surface. The method can, for example, be utilized to produce metallized foams, embossing plates for reproduction of grains and textures, and decorative coatings for substrate materials.

6 Claims, No Drawings

ELECTROLESS METAL PLATED LAMINATES

This is a divisional application of Ser. No. 6,141, filed Jan. 24, 1979 which is a continuation-in-part of application Ser. No. 871,308, filed Jan. 23, 1978, now abandoned; which is a continuation of application Ser. No. 735,243, filed Oct. 26, 1976, now abandoned; which is a division of application Ser. No. 561,957, filed Mar. 25, 1975, now abandoned. Additionally, related to this application is U.S. Ser. No. 735,242, filed Oct. 26, 1976, now U.S. Pat. No. 4,077,853, and U.S. Ser. No. 735,244, filed Oct. 26, 1976, now abandoned, which are continuations of the aforementioned Ser. No. 561,957. The entire disclosures of all of these aforementioned applications are incorporated herein by reference.

BACKGROUND OF THE INVENTION

1. Field of the Invention

This invention relates, in general, to a method of metallizing materials, and particularly concerns a method of providing a substrate material with a coating of a hydrophilic composite material that can be electrolessly metal plated.

2. Prior Art

Various applications for metallizing materials are known. Some examples of these applications are as follows:

Metallized foams having macroscopic interconnected cells therein have been prepared in the prior art. A method of metallizing polyurethane foams, for example, is described in U.S. Pat. No. 3,549,505.

In the '505 patent, a reticular, electrically non-conductive cellular structure of polyurethane having a self-supporting three-dimensional network of inter-connected annulets with macroscopic inter-connected cells therein is coated with a conductive material followed by electroplating. Pyrolysis following the electroplating step is optional.

One method of coating the polyurethane with a conductive material according to the '505 patent is by electroless metal plating. When this method is utilized, the surface of the polyurethane is rendered hydrophilic by cleaning and etching processes. After the surface is rendered hydrophilic, the surface is electrolessly metal plated.

Other methods of producing metallized foams are known. Examples of such methods are described in U.S. Pat. Nos. 3,698,929 and 3,679,552.

A method of plating on plastics is described in U.S. Pat. No. 3,501,332. In this patent, organic polymer substrates are conditioned for electroless metal plating by impregnating the surface layer of the substrates with a metal diffused into the surface layer from a solution of a complex. The complex contains the metal in a zero-valent form dissolved in an organic solvent which has a dissolving or swelling action on the substrate.

Other methods of plating on plastics are known. Examples of such methods are described in U.S. Pat. Nos. 3,597,266; 3,632,388; 3,632,704; 3,661,538; and 3,716,394.

SUMMARY OF THE INVENTION

In accordance with the present invention, a method is provided wherein the surface of a substrate material is coated with a hydrophilic composite material. The hydrophilic character of the composite material enables it to be electrolessly metal plated. Accordingly, this coating step eliminates the need for the cleaning and etching operations that are generally employed in the prior art.

One utility of the present invention is the production of metallized foams. The metallized foams are generally in the form of a substantially rigid, three-dimensional network having macroscopic, interconnected cells therein. The metallized foams are produced by coating cellular materials, the material generally being in the form of a structure having a self-supporting, three-dimensional network of macroscopic, inter-connected cells, with a hydrophilic composite material; electrolessly metal plating the hydrophilic composite material to render the surface conductive; followed by electroplating a metal onto the electrolessly plated metal, and, optionally, pyrolyzing the metallized structure to destroy the cellular material.

Th metallized foam product can be compressed to any desired filling factor for use in heat exchangers, regenerators, catalyst supports, battery plates, electrodes and other applications.

Another utility of the present invention is in the reproduction of textured surfaces. The textured surface, for example, a leather or other material with a surface grain, is metallized by rendering the surface conductive in accordance with the above-described method; followed by electro-plating. The textured surface is then removed from the metal. The side of the metal that was in contact with the conductive textured surface is left with a negative impression on that surface. The metal can thus be used conventionally for an embossing roller or plate to artificially reproduce the textured surface in other materials, for example, plastics.

There are other utilities for the present invention, such as producing decorative metal coatings on substrate materials.

The substrate materials utilized in accordance with the method of the present invention, for any utility that might be envisioned, can be conductive or nonconductive.

DETAILED DESCRIPTION OF THE INVENTION

Various substrate materials can be used in accordance with the present invention. These materials can be flexible or rigid.

Substrate materials utilized to make metallized foams, for example, can be comprised of various cellular materials. Thermally reticulated polyurethane foam is an excellent material as it is inexpensive and readily available. The composition of the cellular material utilized in accordance with this aspect of the present invention, however, is not critical as it is coated with the hydrophilic composite material prior to electroless plating.

Suitable cellular materials include, for example, polyurethane foam, carbon or graphite foams, silicate foams, styrene, aluminum foam, tungsten foam, ceramic foams and other organic and inorganic, open-cell foam materials. Also, cellular materials comprised of textiles such as cotton and other natural fibers, synthetic fibers, natural and synthetic fiber blends, wood products including paper and cardboard and any other material that can be coated with the hydrophilic composite material can be used.

In the reproduction of textured surfaces, the substrate material utilized can be comprised of any material having a textured surface. The material can, of course, be conductive or nonconductive. When conductive materials are used, the hydrophilic intermediate coating serves as a parting media for making embossing rollers or plates.

Exemplary materials include leather, textured polymeric materials, wood, natural or synthetic fibers and other organic and inorganic materials. Any other material that can be coated with the hydrophilic composite material also can be used.

It is clear from the foregoing that virtually any solid material can be utilized as a substrate and can be metallized in accordance with the present invention. Selection of a substrate material is therefore left to those skilled in the art who practice the present invention.

Coating the substrate material is effected by contacting it with a composite material system which is a solution which contains the components of the hydrophilic composite material. Coating is, for example, by spraying, brushing or dipping the solution. The composite system, i.e. the solution, should dry as rapidly as possible; generally in less than about fifteen minutes at room temperature.

The composite material system comprises at least one solvent and a suitable hydrophilic composite material. The hydrophilic composite material is comprised of a blend of at least one film forming component and at least one hydrophilic component.

The hydrophilic component may be a water insoluble hydrophilic component, a water soluble polymeric component (which is inherently hydrophilic) or mixtures thereof. The mixtures of hydrophilic components tend to provide coatings having enhanced wettability and plateability when compared to a blend having only a single hydrophilic component. It is highly preferred that the hydrophilic component be a water soluble polymeric component.

The following theoretical discussion explains how the foregoing composite material system forms a hydrophilic surface. This discussion is theoretical only and is not intended to limit the scope of the present invention.

Each component of the composite material system has a particular function in forming the hydrophilic composite material coating.

The film forming component gives the hydrophilic composite material coating strength, thus eliminating the possibility of disintegration of the coating during subsequent treatments. That component also provides some adhesion of the coating to the substrate material during the subsequent treatment and plating steps.

The hydrophilic component renders the hydrophilic composite material coating wettable to aqueous electroless metal plating solutions. The preferred water-soluble polymeric component is inherently hydrophilic due to its water solubility and it has the further effect of producing a microporous surface on the coating. This microporous surface is produced when the water-soluble polymeric component in the surface of the coating is partially dissolved on contacting water or water solutions of organic or inorganic salts. The water soluble polymeric component is dispersed throughout the coating, and thus, when it dissolves, micropores are left in the surface of the coating.

If a water soluble polymeric component is not utilized in the composite material system and only a water insoluble hydrophilic component is utilized, the composite material surface will be rendered hydrophilic, and thus wettable, but not microporous. Thus, the use of a water soluble polymeric component enhances the wettability and plateability of the composite material coating.

The solvents serve to dissolve all of the foregoing components into a homogeneous solution. Selection of the solvents is based on conventional knowhow for preparing solvent-based coatings.

The components of the composite material system are preferably compatible so that when they are dissolved in a suitable solvent system, there is no phase separation and the composite material system is thus a clear solution. Some deviation from the preferred compatibility can, however, be tolerated. For example, a slightly cloudy solution and a solution wherein phase separation occurs after standing, can give excellent results within the scope of the present invention.

The operability of any composite material system can be determined by one skilled in the art by testing and by utilizing the literature and manufacturers' tables on compatibility of the various components in various solvents and the compatibility of various solvents in other solvents.

Useful literature for selecting solvents includes the following: *The Technology of Solvents and Plasticizers*, A. K. Doolittle (N.Y., 1954); *Solvents Guide*, Marsden and Mann (N.Y., 1963); *Industrial Solvents*, I. Mellan (N.Y., 1950); and *Properties of Organic Solvents*, J. E. Morgan (1962). All of these references are incorporated herein by reference.

Preferred solvents for the preferred hydrophilic composite material used in this invention are chlorinated alkyls (e.g., 1,2-dichloroethane), ketones (e.g., methyl ethyl ketone, methyl isobutyl ketone) and aliphatic alcohols (e.g., ethanol, isopropyl alcohol), tetrahydrofuran and mixtures thereof. A particularly preferred solvent system consists of 44.5%, 1,2-dichloroethane, 44.5% methyl ethyl ketone and 11% ethanol (by volume).

Information on selecting film forming components can be found in various publications including publications on paints. Exemplary literature includes the following: *Synthetic Resins and Coatings*, Noyes Data Corporation (1965) and *Paint Additives*, Noyes Data Corporation (1970). Both of these references are incorporated herein by reference. Particularly preferred film forming components are vinyl chloride, vinyl acetate and copolymers thereof; certain cellulose esters, such as cellulose acetate butyrate; and certain polyvinyl acetals, such as polyvinylbutyral.

In addition to the foregoing references, water insoluble hydrophilic components and water-soluble polymeric components can be selected from references such as: *Modern Plastics Encyclopedia*, Vol. 51, No. 10A (McGraw Hill, October, 1974), which is incorporated herein by reference. A particularly preferred water soluble polymeric component is polyvinyl pyrrolidone. A particularly preferred water insoluble hydrophilic component is cellulose acetate.

The trade literature of manufacturers can also be utilized to select the various components and solvents for the present invention.

The solids content of the components in the composite material system is generally from about one percent to about 40 percent by weight of the system. The weight ratio of the hydrophilic component to the film forming component is generally from about 0.1:1 to about 3.33:1. When a water-soluble polymeric component is utilized, the weight ratio of that component to the film forming component is preferably from about 0.1:1 to about 2:1.

The coated surface dries in a relatively short time at room temperature through evaporation of solvent. The cleaning and etching processes utilized in the prior art may thus be replaced by the present invention, which is effectively, a one-step coating process.

The thickness of the hydrophilic composite material coating is generally from about 0.05 mils to about 5 mils.

The hydrophilic composite material coating is made conductive by electroless metal plating. Any conventional electroless metal plating method can be used. Suitable methods are described in U.S. Pat. No. 3,667,972 and *Plating on Plastics with Metals*, J. McDermott (Noyes Data Corp., 1974). Both of these references are incorporated herein by reference.

Electroless nickel, copper, silver and other electroless plated metals can be used.

Once the surface of the hydrophilic composite material coating is rendered conductive by electroless metal plating any conventional electroplating technique can be used. Suitable electroplating methods are described in *Modern Electroplating*, F. A. Lowenheim (J. Wiley, 1942); *Electroplating Engineering Handbook*, A. K. Graham (Rheinhold, 1962); and *Handbook Galvanotechnik*, Karl Hanser Verlag (Munich, 1966). All of these references are incorporated herein by reference.

The type of metal electroplated will generally be selected on the basis of economics and the end use of the metallized material.

If the substrate material is a cellular material, for example, the metallized foam product might be used in a heat regenerator. In this case, an electroplated metal having high heat conductivity and high heat capacity would be selected. Typical metals would then be nickel, copper or chromium.

Metallized foams made in accordance with the present invention can be modified by several subsequent procedures for particular applications. The following two operations exemplify such subsequent procedures and can be performed alone or in combination with others:

(1) Pyrolysis to destroy organic materials, and
(2) Compression to dimensions required for the desired filling factor.

Pyrolysis can only be carried out when the cellular material is organic. Methods of pyrolysis are described in the '505 patent, the entire disclosure of which is incorporated herein by references, and other methods are well-known in the art. The need for pyrolysis depends on the end use for the metallized foam. For example, if that use is to be in a hot environmental that could destroy the cellular organic material, pyrolysis prior to use would be desirable.

Under appropriate conditions, the pyrolysis step can be carried out simultaneously with annealing of the brittle electro-plated metal. The parameters under which the electroplated metals can be annealed depend upon the type of metal. These parameters are well-known to those skilled in the art. Once annealing is carried out, the shape of the metallized foam can be changed by compression, bending, twisting or otherwise.

The annealed metallized foam can be compressed for applications where a low filling factor is needed. The filling factor is defined as follows:

Filling Factor:

$$(V_1 - V_2)/V_1$$

where: $V_1$ is the volume of a solid having the over-all dimensions of the metallized foam and $V_2$ is the actual volume of the metallized foam, for example, the water displacement volume. Applications requiring a low filling factor are well-known in the art and can include, for example, uses of the metallized foam as a catalyst support or a heat exchanger.

It is advantageous to metallize a cellular material having a high filling factor. This is because the cells are larger and the screening effect of the cell walls during the electroplating is thereby minimized. Accordingly, more uniform electroplating can be achieved in a foam having a high filling factor.

If the substrate material is a textured material, electroplated metal having sufficient strength to be used as an embossing roller or plate would be selected. Metals such as iron, nickel, copper and combinations thereof (alloys) among others, are suitable for this purpose. As in the case of metallized foam, the brittle electroplated metal can be annealed to improve strength. This annealing step can be carried out simultaneously with pyrolysis of the textured material also can be removed before or after annealing by separating it from the metal. This can be done by conventional means such as by mechanical or chemical means.

The following examles are submitted to illustrate but not to limit the present invention.

EXAMPLE I

A series of experiments was conducted to select composite material systems suitable for plating on glass substrates. Glass slides were utilized and viewed under a microscope to determine the quality of the composite material coating and the platability with electroless nickel. Electroless nickel plating was carried out in accordance with U.S. Pat. No. 3,667,972.

Stock Solutions I through IV were made up with 10% solids, by weight, in a cold solvent system:

STOCK SOLUTION

I. 86%–14% vinyl chloride-vinyl acetate (a film forming component)
II. 87%–13% vinyl chloride-vinyl acetate (a film forming component)
III. polyvinylpyrrolidone (a water soluble polymeric component)
IV. polyvinylbutyral (a film forming component)

The solvent system used to make up Stock Solutions I through IV contained:

|  | Parts by Volume | Percent by Volume |
| --- | --- | --- |
| 1,2 dichloroethane | 100 | 44.5 |
| methyl ethyl ketone | 100 | 44.5 |
| ethanol | 25 | 11.0 |

The components of the composite material system will be designated in the following sub-examples by the Roman numerals used to identify the foregoing Stock Solutions.

A

Ten milliliters of I. were mixed with 5 milliliters of III. A clear solution resulted. This composite material system was then brushed onto a glass slide and allowed to dry for 5 minutes at 70° F. The dry film was clear and smooth. Electroless nickel plating was then carried out.

Ninety percent coverage with electroless nickel was achieved.

B

Five milliliters of cellulose acetate butyrate (a film forming component) were added to the composite material system of A. The resulting solution had a pearl-like appearance and separated into layers on standing. After stirring the solution, the same procedure as in A was followed. A dry film that was grainy and cloudy resulted. Plating with electroless nickel gave ninety percent coverage with some blistering.

C

Twenty milliliters of I were mixed with 5 milliliters of III. A clear solution resulted. The same procedure as in A was followed. The dry film was clear and smooth. Plating with electroless nickel gave ninety-five percent coverage.

D

Five milliliters of cellulose acetate (a water insoluble hydrophilic component) were added to the composite material system of A. The resulting solution was opalescent but did not separate into layers on standing. The same procedure as in A was followed. The dry film was cloudy but smooth. Ten percent coverage with electroless nickel was achieved. The poor plating results are due to the incompatability of the solvent with the cellulose acetate and the coaction of the cellulose acetate with the other components.

E

Five milliliters of II were added to the composite material system of A. A clear solution resulted. The same procedure as in A was followed. The dry film was clear and smooth. One hundred percent coverage with electroless nickel was achieved.

F

Five milliliters of IV were added to the composite material system of A. The resulting solution was hazy but did not separate into layers on standing. The same procedure as in A was followed. A dry film was clear and smooth. One hundred percent coverage with electroless nickel was achieved.

G

Fifteen milliliters of II and 5 milliliters of IV were added to the composite material system of A. The solution was opalescent. Ten milliliters of methyl isobutyl ketone, as a solvent, was added but no improvement in solution compatibility was observed. Ten milliliters of isopropyl alcohol, as a solvent, was then added. The solution was still opalescent, probably due to the insolubility of polyvinyl-pyrolidone in methyl isobutyl ketone. The solution separated into two components on standing. After stirring the solution, the same procedure as in A was followed. The dry film was smooth and clear. One hundred percent coverage with electroless nickel was achieved.

H

Ten milliliters of II and one milliliter of IV were added to the composite material system of A. An additional 20 milliliters of the above-defined solvent system was also added. The resulting solution was clear. The same procedure as in A was followed. The dry film was smooth but cloudy. One hundred percent coverage with electroless nickel was achieved.

I

An additional 10 milliliters of stock solution I were added to the composite material system of J. The same procedures as in H were followed and yielded the same results except that the dry film was clear.

J

Five milliliters of II and 5 milliliters of IV were added to the composite material system of C. An additional 20 milliliters of the above-defined solvent system was also added. The resulting solution was clear. The same procedure as in A was followed. The dry film was clear and smooth. One hundred percent coverage with electroless nickel was achieved.

K

Ten milliliters of stock solution I, 10 milliliters of II, 2 milliliters of III, 2 milliliters of IV and 20 milliliters of the above-described solvent system were mixed. The resulting solution was clear. The same procedure as in A was followed. The dry film was clear and smooth. One hundred percent coverage with electroless nickel was achieved.

The procedure of K was repeated except that the coating was peeled off prior to electroless plating. The thickness of the coating was 0.3 mil.

The procedure was again repeated except that two and three coatings were applied to the glass slide. These coatings had thicknesses of 0.6 mil and 0.9 mil, respectively. Plating on the double and triple coated slides gave one hundred percent coverage with electroless nickel.

EXAMPLE II

A thermally reticulated polyurethane foam was coated with about 0.3 mil thickness of a hydrophilic composite material.

The hydrophilic composite material contained:
- 4 grams—polyvinylpyrrolidone (a water soluble polymeric component)
- 8 grams of a 90–10% mixture of vinyl chloride-vinyl acetate copolymer (a film forming component)
- 8 grams of a 87–13% mixture of vinyl chloride-vinyl acetate copolymer (a film forming component)
- 5 grams of cellulose acetate butyrate (a film forming component)

The foregoing components were dissolved in a solvent of:
- 50 milliliters of ethyl dichloride,
- 125 milliliters tetrahydrofuran, and
- 50 milliliters of methyl ethyl ketone.

This formulation is suitable for dipping or brushing. It was, however, adapted for spraying by diluting it in a 1:2 or 1:3 ratio with a solvent mixture of the following composition: ethyl dichloride-22%; tetrahydrofuran-56%, and methyl ethyl ketone-22%. In this example the polyurethane form was sprayed with the composite material system to effect coating.

The polymer coating was allowed to dry for five minutes at room temperature (22° C.) and this was followed by electroless nickel plating as described in U.S. Pat. No. 3,667,972. This step was followed by conventional electroplating of copper to a thickness of about 10 mils.

A layer of nickel was then electroplated to a thickness of about 4 mils on the copper followed by pyrolysis at 760° C. under a hydrogen atmosphere for one hour. The resulting metallized foam was ductile.

EXAMPLE III

A swatch of leather was sprayed to a thickness of about 0.4 mils with the following composite material system:

- 4 grams polyvinylpyrrolidone (a water soluble polymeric component)
- 8 grams 90–10 vinyl chloride-vinyl acetate copolymer (a film forming component)
- 5 grams cellulose acetate butyrate (a film forming component)
- 100 milliliters ethylene dichloride (solvent)
- 250 milliliters tetra-hydrofuran (solvent)
- 100 milliliters methyl ethyl ketone (solvent)

The coated leather was dried at about 23° C. for ten minutes. The coating was then plated with electroless nickel as described in U.S. Pat. No. 3,667,972. This step was followed by conventional electroplating of copper to a thickness of about 15 mils. The leather and the hydrophilic composite material layer were then peeled off leaving a high resolution copper negative of the textured leather surface.

Various modifications of the copper negative can be carried out. For example, a backing material such as a metal or rubber pad can be fastened to the back of the negative for added strength. Also, a thin coating of a harder metal such as chromium or nickel can be plated on the negative side for improved hardness without impairing the resolution of said negative. Other modifications apparent to those skilled in the art can be carried out.

Having set forth the general nature and some examples of the present invention, the scope is now particularly set forth in the appended claims.

What is claimed is:

1. A laminate comprising a substrate material provided with a coating of a non-conductive hydrophilic composite material and said composite material provided with a coating of an electrolessly plated metal wherein the hydrophilic composite material is comprised of a blend of at least one film forming component selected from the group consisting of vinyl chloride, vinyl acetate and copolymers thereof; and cellulose esters and polyvinyl acetals; and at least one hydrophilic component of a water soluble polymeric component, the water soluble component being polyvinyl pyrrolidone, the water soluble component being dispersed throughout the coating of the composite material producing a microporous surface upon contacting the composite material with water or a water solution of salts which dissolve the water soluble component.

2. The laminate of claim 1, wherein the coating of the electrolessly plated metal is further provided with a coating of an electroyltically plated metal.

3. The laminate of claim 1, wherein the substrate material is a cellular material.

4. The laminate of claim 1, wherein the coating has a thickness of about 0.05 mils to about 5 mils.

5. The laminate of claim 1, wherein the weight ratio of hydrophilic component to the film forming component is about 0.1:1 to about 3.33:1.

6. The laminate of claim 1, wherein the weight ratio of the water soluble polymeric component to the film forming component is about 0.1:1 to about 2:1.

* * * * *